United States Patent [19]
Rhee

[11] Patent Number: 5,482,877
[45] Date of Patent: Jan. 9, 1996

[54] METHOD FOR MAKING A SEMICONDUCTOR DEVICE HAVING A SILICON-ON-INSULATOR STRUCTURE

[75] Inventor: Taepok Rhee, Seoul, Rep. of Korea

[73] Assignee: Samsung Electronics Co., Ltd., Suwon, Rep. of Korea

[21] Appl. No.: 197,480

[22] Filed: Feb. 16, 1994

[30] Foreign Application Priority Data

Feb. 17, 1993 [KR] Rep. of Korea ............... 93-2208

[51] Int. Cl.⁶ .................................................. H01L 21/786
[52] U.S. Cl. .................. 437/40 RG; 437/21; 437/927
[58] Field of Search ........................... 437/21, 40, 62, 437/203, 927; 148/DIG. 77, DIG. 150, DIG. 73

[56] References Cited

U.S. PATENT DOCUMENTS

| | | | |
|---|---|---|---|
| 4,619,034 | 10/1986 | Janning | 437/21 |
| 5,120,666 | 6/1992 | Gotou | 437/203 |
| 5,188,973 | 2/1993 | Omuro et al. | 437/203 |

OTHER PUBLICATIONS

Silicon–On–Insulator "Gate–All–Around Device" by J. P. Colinge, M. H. Gao, A. Romano–Rodriquez, H. Maes, and C. Claeys, IMEC, Kapeldreef 75, 3030 Leuven, Belgium—IEEE (1990).

Primary Examiner—Chandra Chaudhari
Attorney, Agent, or Firm—Stephen R. Whitt; Charles R. Donohoe

[57] ABSTRACT

A method for making a semiconductor device having a silicon-on-insulator structure comprises the steps of: forming a pad oxide on a wafer which has a lower silicon substrate, a buried oxide layer and an upper silicon layer, forming an oxynitride region on a predetermined portion of the buried oxide layer; forming an active silicon layer to intersect the oxynitride region, and forming a cavity by wet-etching the exposed oxynitride region; forming a gate insulating layer on the surface of the exposed active silicon layer; forming a polysilicon to fill the cavity surrounding said active silicon layer and removing a predetermined portion of the doped polysilicon to form a gate electrode; and forming source and drain regions on the active silicon layer separated by the gate electrode.

4 Claims, 11 Drawing Sheets

METHOD FOR MAKING A SEMICONDUCTOR DEVICE HAVING A SILICON-ON-INSULATOR STRUCTURE

BACKGROUND OF THE INVENTION (1) Field of the Invention

The present invention relates to a method for making a semiconductor device in a silicon semiconductor well surrounded by an insulating layer by means of silicon-on-insulator techniques.

(2) Description of the Prior Art

Active parasitic devices, such as, parasitic metal oxide semiconductor transistors or parasitic bipolar transistors are formed in PN junction separation structures that appear in complementary metal oxide semiconductor devices. In addition, there are problems of deterioration of electric devices and soft error the known latch-up phenomenon. In order to prevent these problems and attain high density, silicon-on-insulator (SOI) techniques have been studied having insulating layers formed as sidewalls of an insulating substrate the sidewalls are formed of a material such as $SiO_2$ and silicon single crystalline wells are formed in these insulating layers to form semiconductor devices in the wells.

These techniques have the advantage of perfect isolation of electrical elements, high speed performance, latch-up free operation and being soft error free. A semiconductor device such as CMOS circuits, can be made using these techniques. Second, the width of the insulating layers for isolation depends only on photo-etching, etc. Third, high integration based on the micro-miniaturization can be obtained as well as the application with three-dimensional devices. According to the above techniques, a semiconductor device having an SOI structure is formed by forming an amorphous or polysilicon layer on an amorphous insulating substrate such as $SiO_2$ and performing recrystallization on the polysilicon layer. Separation by implanted oxygen (SIMOX) processes, full isolation by phorous oxidized silicon (FIPOS) processes, or zone melting recrystallization (ZMR) are also known as another approach.

Recently, SOI MOSFETs have been formed on a ultra-thin film of less than 1000 angstroms have been obtained having the effect of removing the kink and improvement of the sub-threshold characteristic curve.

In addition to this, a study has been made of the manufacture of the SOI Gate-All-Around MOSFET structure. When a lower part of a hook-shape gate is formed underneath an active silicon region, in order to form an SOI wafer, the channel length of the lower part is dependent on the channel width region being larger than the lower part of the channel width by isotropic wet etching, and the thickness of a buried oxide layer is more than half of the lower part of the channel width region. Accordingly, there is a limit to increasing the channel width region. If the thickness of the buried oxide layer of the SOI wafer is increased, energy and dose of oxygen ion implantation is remarkably increased, and defects are generated in the active silicon region to degrade the electrical characteristics.

In accordance with the present invention, there are made a perfect separation implanted oxygen (SIMOX) wafer and a partial separation implanted nitrogen (SIMNI) wafer, and by forming a buried oxide layer and an oxynitride layer included in the buried oxide layer and partially buried and making devices by selective etching, a channel length region is formed to be independent to a channel width or a thickness of the buried oxide layer.

SUMMARY OF THE INVENTION

It is an object of the present invention to provide a silicon-on-insulator metal oxide semiconductor field effect transistor (SOI MOSFET).

According to the present invention, a method for making a semiconductor device of silicon-on-insulator structure comprises the steps of:

forming a pad oxide on a wafer including a lower silicon substrate, a buried oxide layer or a buried nitride layer, and an upper silicon layer, and forming an oxynitride region on a predetermined portion of the buried oxide layer;

forming an active silicon layer to intersect the oxynitride region, and forming a cavity by wet-etching the exposed oxynitride region;

forming a gate insulating layer on the surface of the exposed active silicon layer;

forming a polysilicon to fill the cavity surrounding said active silicon layer and removing a predetermined portion of the doped polysilicon to form a gate electrode; and forming source and drain regions on the active silicon layer separated by the gate electrode.

DETAILED DESCRIPTION OF THE PREFERRED EMBODIMENT

In order to describe the contect of the present invention, the making of a silicon-on-insulator gate-all-around (SOI GAA) metal oxide semiconductor field effect transistor (MOSFET) is now described in detail based on "SILICON-ON-INSULATOR" "GATE-ALL-AROUND DEVICE" in pp 595–598 of IEDM written by J.P. Colinge and published on 1990.

First, there is prepared a separation implanted oxygen silicon-on-insulator (SIMOX SOI) wafer having a buried oxide layer 2 and an upper silicon layer 3 on a lower silicon substrate.

Figure 1:
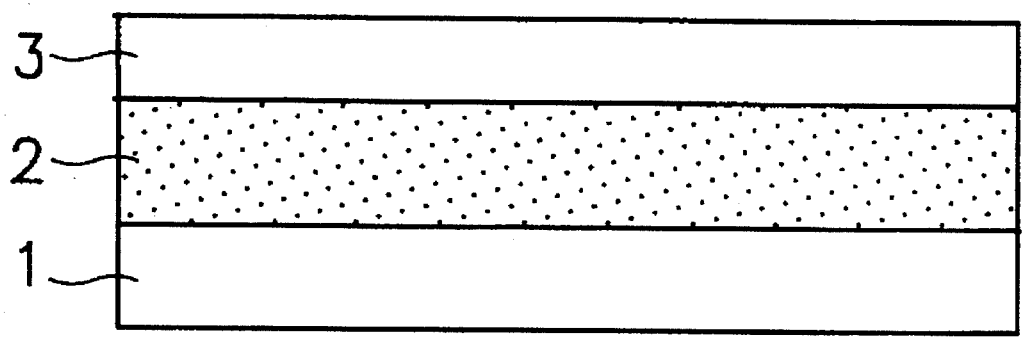
FIGS. 1 to 5C are the steps in the manufacture of a conventional silicon oxide insulator metal oxide semiconductor field effect transistor (SOI MOSFET)
Figure 2:
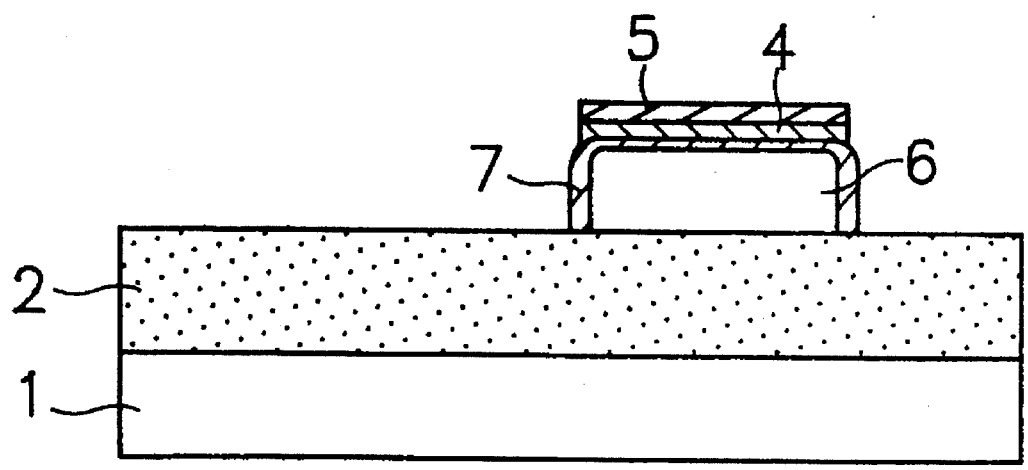

A pad oxide layer and a silicon oxide layer are formed over all the upper silicon layer 3, and a pattern having a section as shown in FIG. 2 through photo-etching processes, is formed.

The patterned upper silicon layer now becomes an active region 6, and the pad oxide layer 4 and silicon nitride layer 5 remain on top of the active region 6. The sidewalls of the silicon layer of the active region is exposed and thermally oxidized to form a thermal oxide layer 7 thereby surrounding the active region with an insulating layer.

The side walls of the active region are thermally oxidized and squarish parts of the active region 6 are thus made round. By rounding the edges where each side meets reduces the high electric field concentration of the edge thus presently the degradation of electrical characteristics such as leakage current or deterioration of the gate oxide layer.

Referring now to FIG. 2, the silicon nitride layer 5 is removed by etching and a gate electrode is formed through photo-etching processes. The shape of the active region corresponds to a rectangular-formed region designated by "A" in FIG. 3A.

Figure 3A:
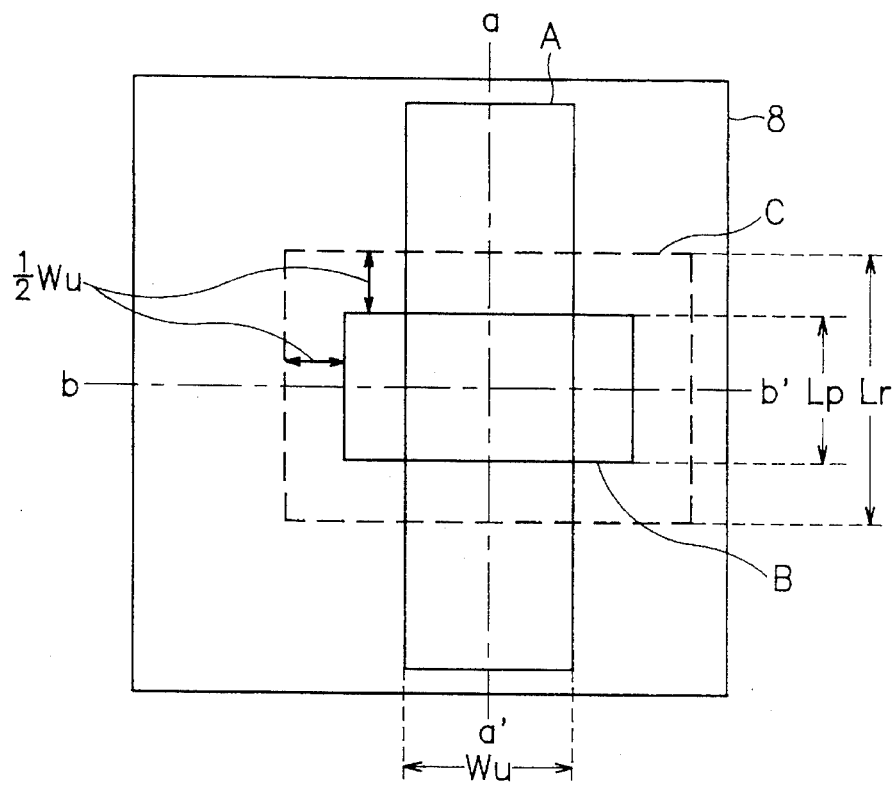
Figure 3B:
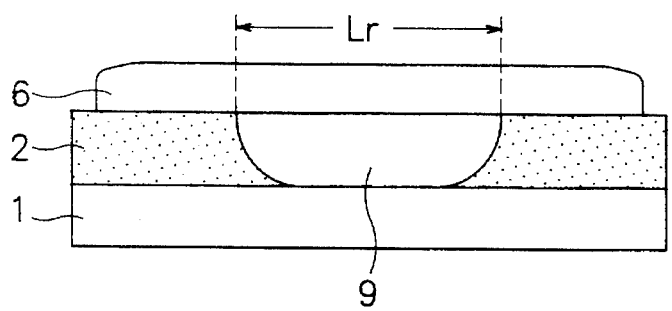
Figure 3C:
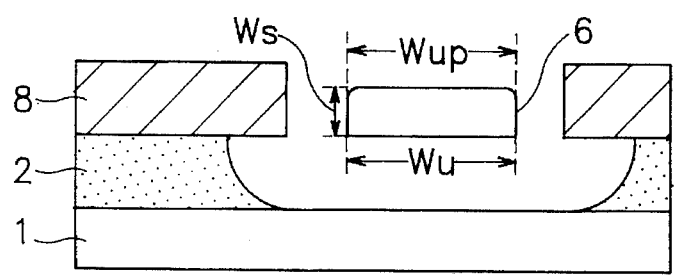

The pattern of FIG. 3A is photoresist 8, and is disposed on the substrate of FIG. 2. An opened region "B" is to be etched. A region "C" is larger than the "B" region, because of undercutting by wet-etching with a hydrofluoric solution. FIG. 3B is a sectional view taken along line a—a' of FIG. 3A. FIG. 3C is a sectional view as taken along line b—b'. There is formed a cavity 9 that penetrates around the center of the active region 6 by undercutting by wet-etching. At this point, the nitride layer is etched, and the oxide layers surrounding the active region are removed to expose the pad oxide layer 2.

Figure 4A:
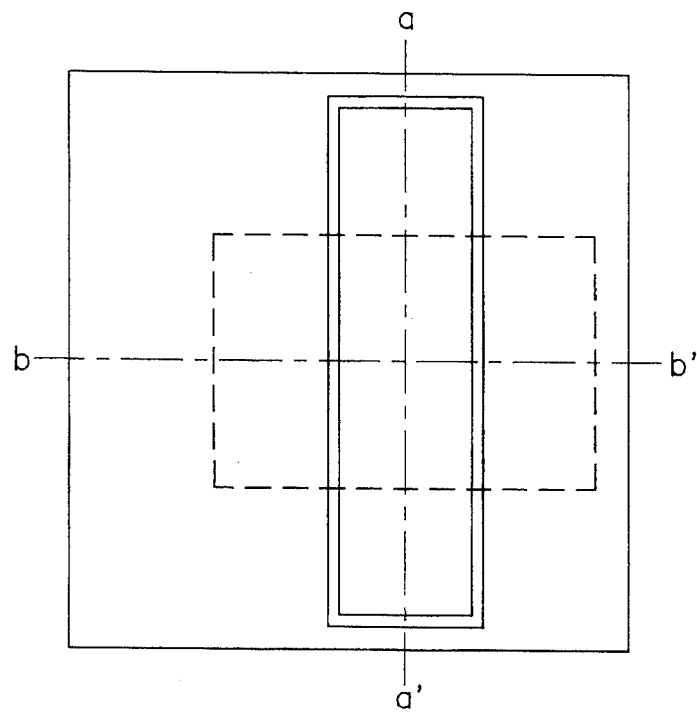
Figure 4B:
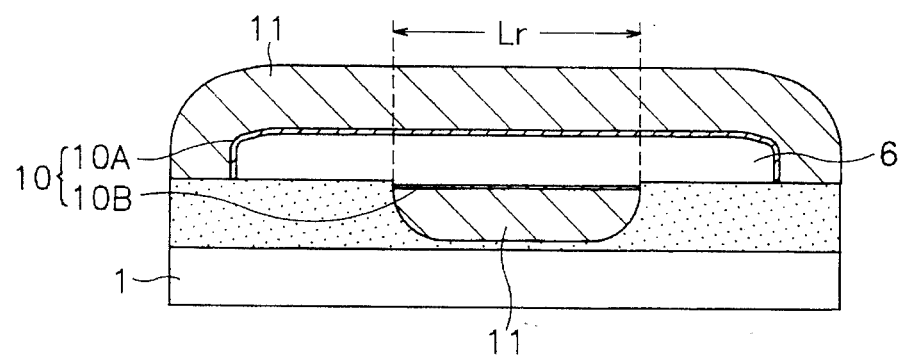

The photoresist 8 is removed after the steps in FIGS. 3A to 3C, and a gate oxide layer is formed on the surface of the active region 6, as shown in FIG. 4B. A cavity the size of "$L_r$" under the active region in FIG. 3A is a region where the silicon layer is exposed even in the active region, and an oxide layer 10B is formed as large as the size of "$L_r$" in FIG. 4B. The gate oxide layer 10A is formed, and ion implantation and annealing are performed to regulate a threshold voltage $V_t$ as is known in the art. A polysilicon layer 11 is formed to fill the cavity, and the side surfaces and top of the active silicon region 6 are covered thereby.

Figure 4C:
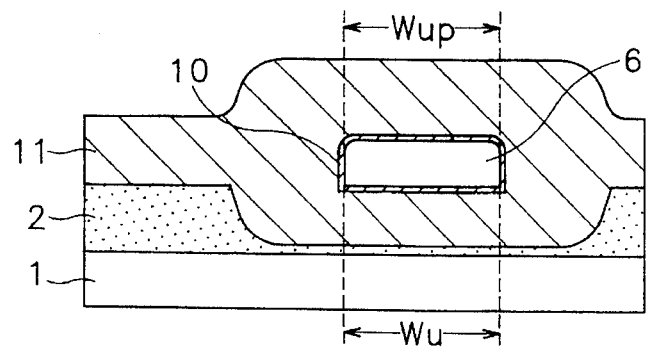

FIG. 4A is a plan view of the resultant structure after the polysilicon layer has been formed, and FIGS. 4B and 4C are respectively sectional views as taken along lines a—a' and b—b'.

Figure 5A:
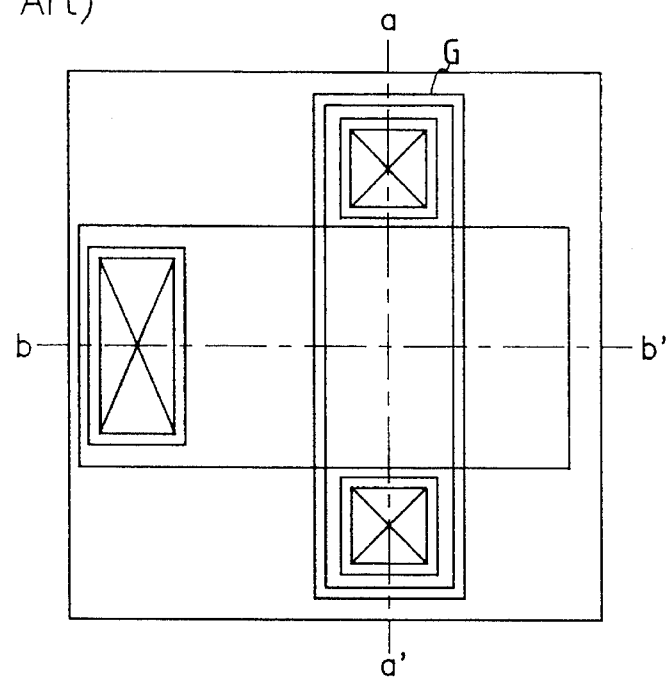
Figure 5B:
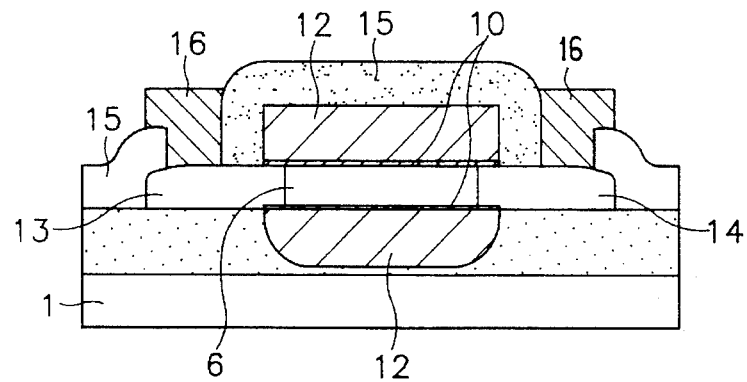
Figure 5C:
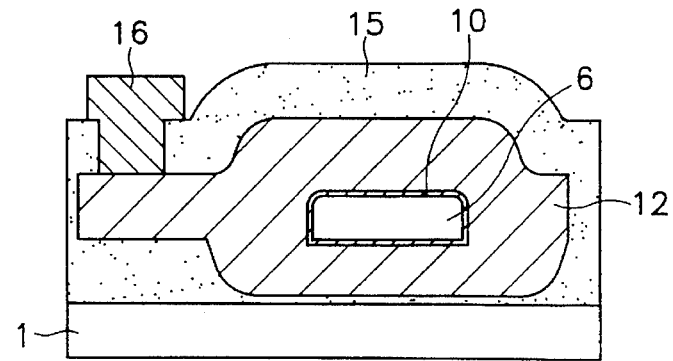

As shown in FIG. 5B, the polysilicon layer 11 of FIG. 4B is patterned to form a gate electrode 12 by photo-etching. The pattern of the photoresist layer is shown in FIG. 5A. A region indicated by "G" in FIG. 5A is a gate electrode pattern, and the gate electrode 12 is formed by dry-etching. FIGS. 5B and 5C are respectively sectional views taken along lines a—a' and b—b'. Ion implantation and drive-in processes are performed after the photoresist layer is removed, and source and drain regions 13, 14 are formed. An interlayer insulating layer 15 is coated, and photo-masking and opening for a contact hole and removal of photoresist are performed. A first metal is deposited, and a first metal photo-masking, a first metal-etching, and removal of the photoresist layer are performed to form a first metal line 16.

If a gate voltage $V_G$ is applied to this SOI GAA structure MOSFET, a reverse layer is formed around the surface of the gate of the active (channel) silicon region 6. If a drain voltage $V_D$ is applied between the source and drain regions, a channel current $I_D$ flows. The channel current $I_D$ is expressed as the following equation 1:

$$I_D = \frac{-Q_n W \mu V_D}{L} \quad (1)$$

The letters appearing in the equation (1) designate the following: a channel width W; mobility µ; channel length L; and a conductive electric charge per unit area $Q_n$. Channel transition time $T_{tr}$ is proportional to the channel length, and inversely proportional to mobility and drain voltage, which is expressed as the following equation (2):

$$T_{tr} = \frac{L^2}{\mu V_D} \quad (2)$$

The channel drain electrode current $I_D$ is proportional to the conductive electric charge amount within the reverse layer, and is inversely proportional to the channel transition time $T_{tr}$, which is expressed as the following equation (3):

$$I_D = \frac{-Q_N}{T_{tr}} \quad (3)$$

Accordingly, if the channel width/length (W/L) increases in the above equations (1) to (3), the channel drain electrode current $I_D$ may be increased, and the channel length may be reduced so that the channel transition time $T_{tr}$ may be reduced.

However, the above discussion is totally theoretical, and does not come true in a practical process. The reason for this will now be described.

The cavity 9 is formed by means of undercutting by wet-etching to form a gate underneath the active silicon region the of SOI GAA structure MOSFET. The channel length Lr, however, is actually larger than the channel width $W_u$ of the lower part of the gate, as shown in FIG. 3A. This results from $L_{ove}$ amount according to reasons of variation of $L_p$ by excessive etching at the time of wet-etching because there is a restriction to maintaining $L_p$ width, a limit of photo-etching. In addition, the wet-etching acts as an isotropic etch. That is, Lr appears as $L_p + W_u + L_{ove}$. Besides, the real channel width $W_r$ is made by adding upper and lower portions and both side surfaces of the channel, and becomes $2(W_u + W_s)$. Strictly, there is a corner effect of $W_s$ where $W_u$ and $W_{up}$ meet, which is not considered for convenience's sake.

The active silicon region in FIG. 3C is formed to be silicon island-like, and must be wet-etched as large as $\frac{1}{2}W_u$ in order that the channel penetrates crossing the silicon island under the silicon island. If wet-etching is performed, the buried oxide layer 2 is etched in the lengthwise direction of the silicon, i.e. toward the channel length from the surface as well as the silicon substrate from the surface. As a result, the silicon island should be etched as large as $\frac{1}{2}W_u$ in order that the channel penetrates when a distance where the channel penetrates the silicon island vertically is $W_u$, i.e. when the channel width under the silicon island is $W_u$, which should be considered regarding the channel length, since the etching is performed excessively in fact.

Besides, the width of the opened region by the gate photo-masking is added to formation of the whole channel length. The channel length $L_r$ is increased as the channel width $W_u$ becomes large.

If the thickness of the buried oxide layer is smaller than $\frac{1}{2}W_u$, the oxide layer is totally etched to expose the silicon substrate. And when the gate oxide layer is formed, the buried oxide layer is oxidized to be an insulated oxide layer having the thickness of the gate oxide layer between the gate lower electrode and the silicon substrate. Thus, the buried oxide layer serves as a capacitive oxide layer between the gate polysilicon and silicon substrate.

The $L_r/W_r$ value is one of the important factors determining the electrical characteristics of the device in a MOSFET. The smaller the $L_r/W_r$ value is, the more the $I_D$ value is increased. The transition time $T_{tr}$ may be reduced such that the performance speed of the device is improved. In the above MOSFET, $L_r/W_r$ becomes $(L_p + W_u + L_{ove})/$ $2(W_u+W_s)$, and $L_r$ and $W_r$ depends on $W_u$ a great deal. As a result, if the channel width $W_u$ is increased, $L_r$ and $W_r$ are increased simultaneously, and $I_D$ and $T_{tr}$ are not improved. Besides, the thickness of the buried oxide layer is increased according to the increase of the $W_u$ value in order to reduce the capacitive effect between the gate polysilicon and silicon substrate. Since the thickness of the buried oxide layer should be larger than $W_u/2+L_{ove}$, the energy and dose of the oxygen ion implantation should be increased at the time of making a SIMOX wafer. Accordingly, high density defects may be caused in the lower channel region of the active silicon region and the production cost is increased.

In the present invention, a partial SIMNI (separation implanted nitrogen) and a whole SIMOX wafer are made by oxygen ion implantation over all the surface and nitrogen ion implantation just over the lower gate at the time of making an SOI wafer. The buried oxide layer is thus formed. A partial oxynitride layer between the upper silicon region and buried oxide is formed by selectively etching the oxynitride in an $H_3PO_4$ solution to form the lower gate region, so as to solve the above problems.

The real channel length $L_r'$ may be formed without regard to the real channel width $W_r'$, and the $I_D$ value and $T_{tr}$ value may be improved thereby making a high performance SOI MOSFET.

The method for making an SOI MOSFET of the present invention is now described.

Figure 6A:
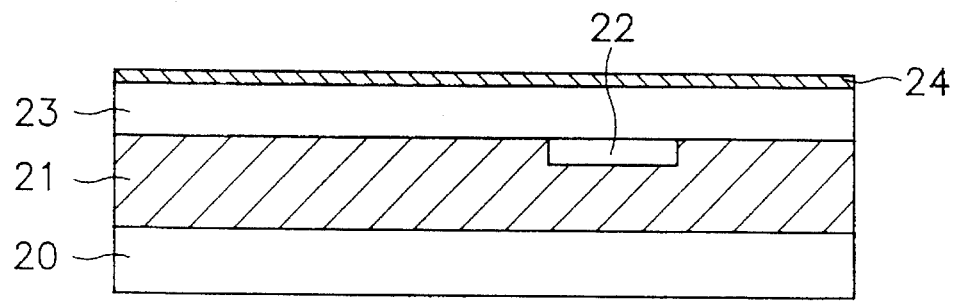
FIGS. 6A to 9C are the steps in the manufacture of a silicon oxide insulator metal oxide semiconductor field effect transistor (SOI MOSFET) in accordance with the preferred embodiment of the present invention.
Figure 6B:
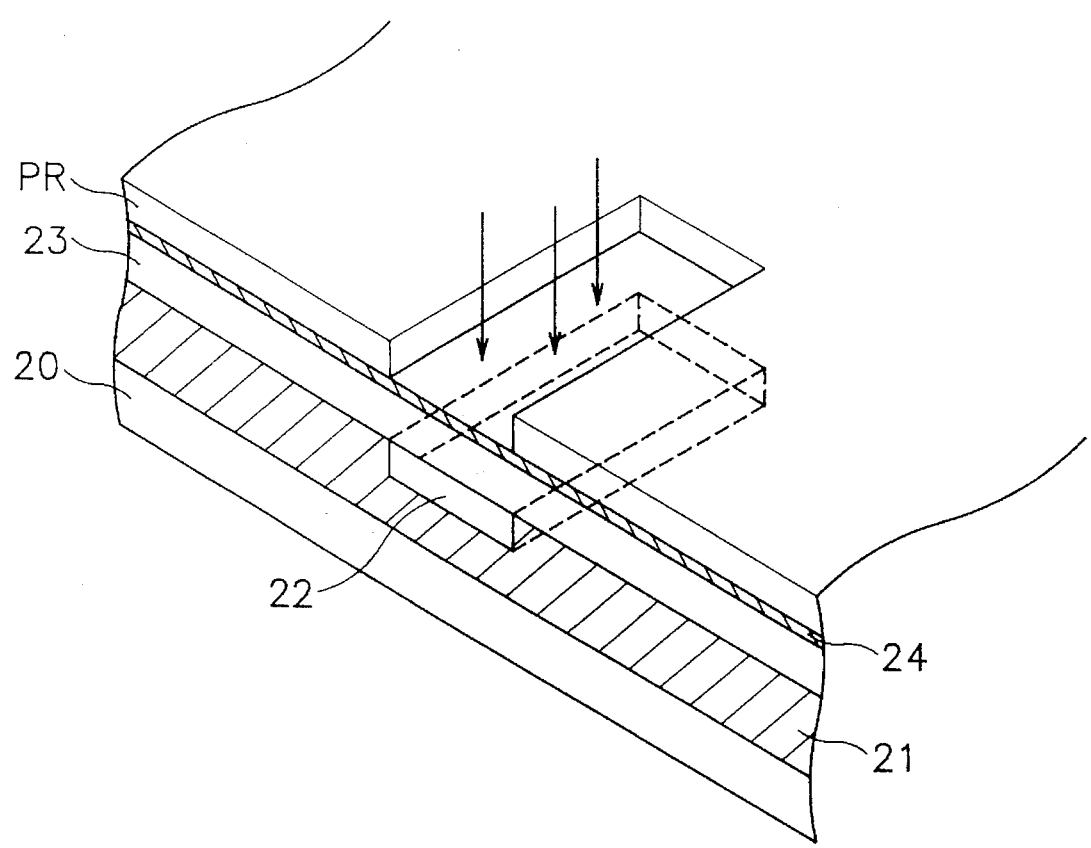
Figure 7A:
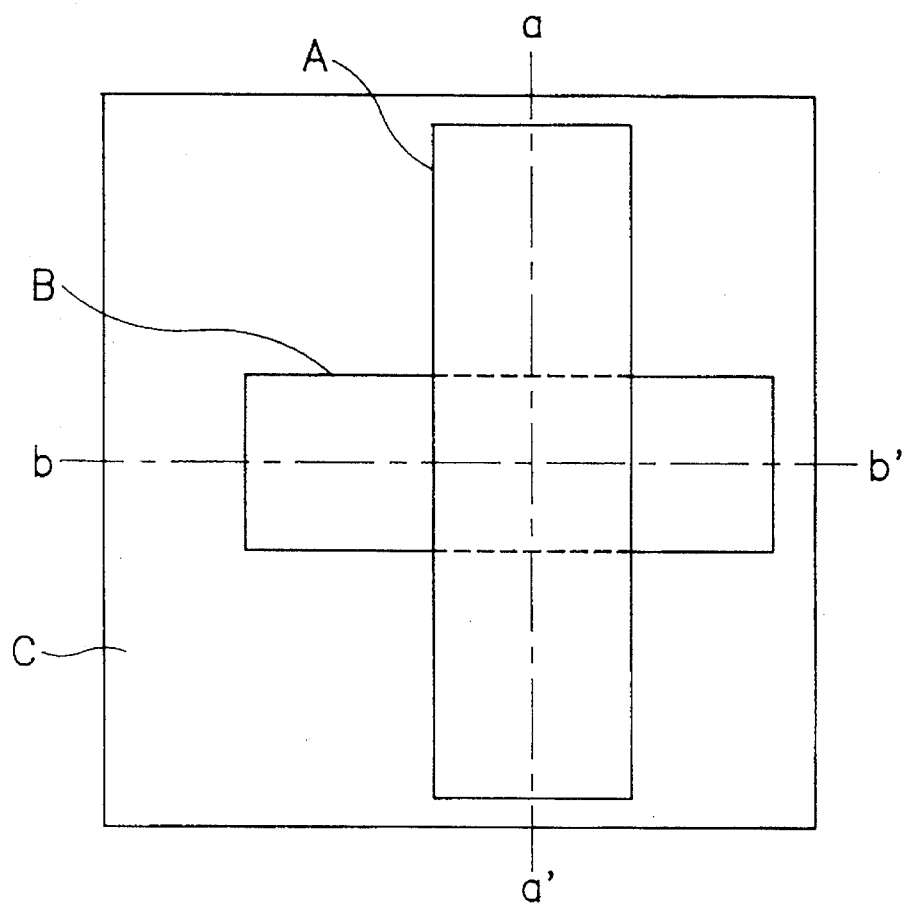
Figure 7B:
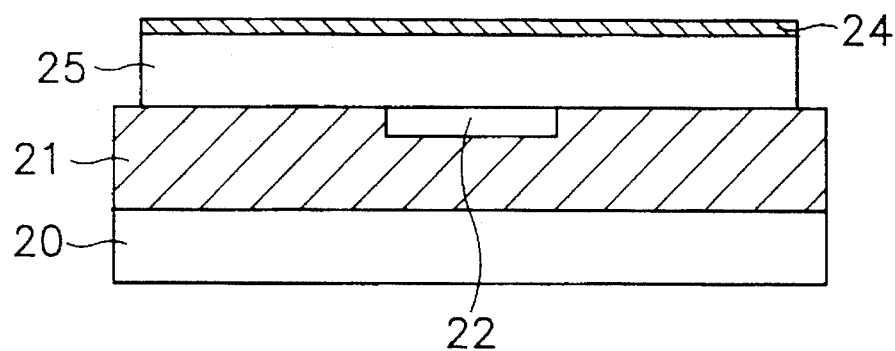
Figure 7C:
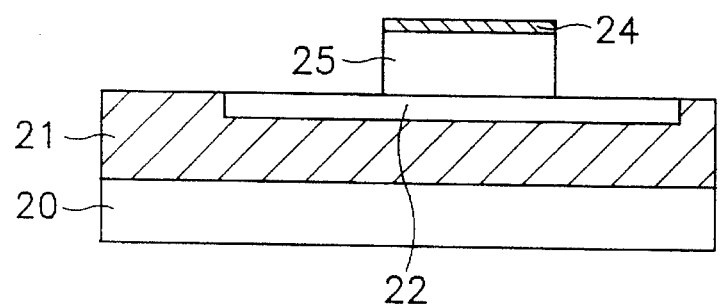
Figure 7D:
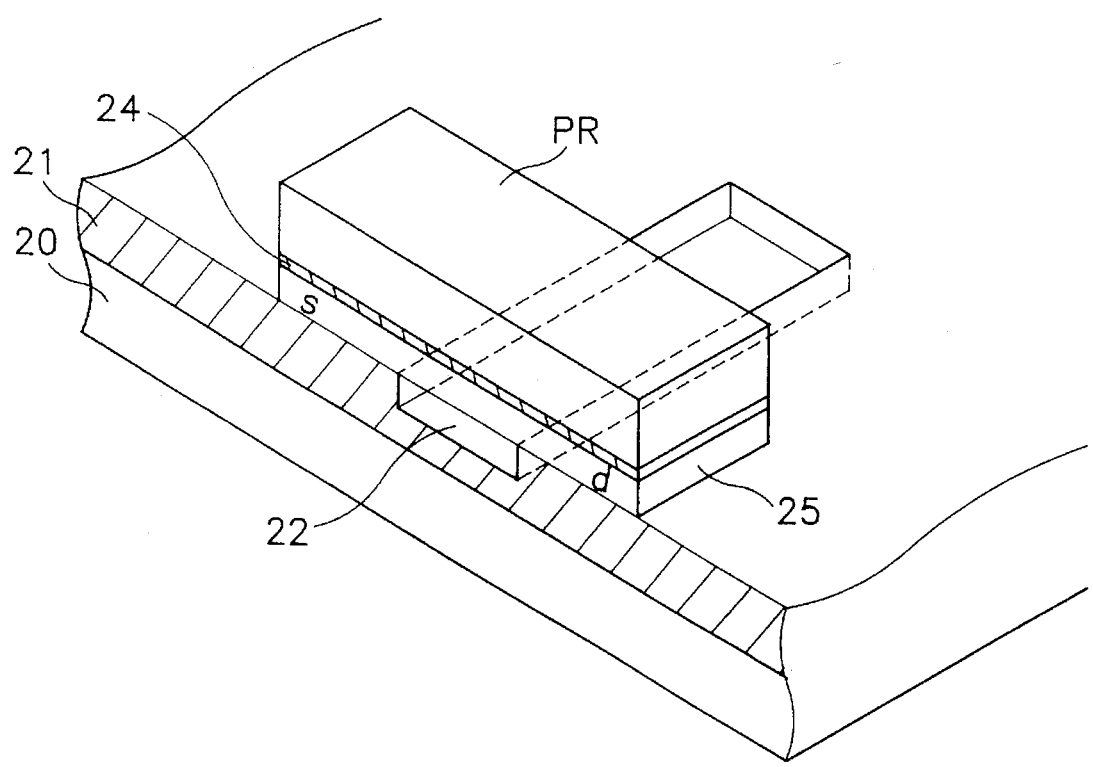

A pad oxide layer 24 is formed on a silicon. substrate 20 as shown in FIG. 6A, and oxygen ion implantation is performed over all the surface. Nitrogen ion implantation is performed by an opened photoresist layer over a selected region corresponding to a position where a gate is formed underneath the active silicon to form an oxynitride region as indicated by "22" of FIGS. 6A and 6B. After the ion implantation is performed by means of a pattern of the photoresist layer "PR" of FIG. 6B, the used photoresist layer is removed. Annealing is carried out by ion implantation, and the silicon substrate 20, a buried oxide layer 21, an oxynitride region 22 and an upper silicon region 23 are formed. In order to form an active silicon region, the pad oxide layer 24 and upper silicon layer 23 are patterned by photo-etching to form a section as shown in FIG. 7B. FIG. 7A is a plan view of the substrate, and FIGS. 7B and 7C are, respectively, sectional views taken along lines a≦a' and b—b' of FIG. 7A. The region "A" is a patterned upper silicon layer 25, and the region "B" is the oxynitride region 22. The region "C" is the surface of the buried oxide layer 21 of FIG. 6. FIG. 7D is a perspective view thereof.

The PR layer of FIG. 7D is removed, and the oxynitride layer partially opened is undercut-etched by a wet-etching method, and the pad oxide layer is also removed. The width of the oxynitride layer is determined by the opened region of the PR layer formed by photo-masking in FIG. 6B. Even if the length of the PR layer that is etched at the time of undercut-etching the oxynitride layer is long, etching the oxynitride layer is more speedy than etching an oxide layer, and the excessive etching hardly occurs in the lengthwise direction of the channel.

A part of the oxynitride layer is removed to be a cavity, and the pad oxide layer is etched by the same etching solution. The oxynitride is completely removed 100 times as fast as compared with the oxide.

Figure 8A:
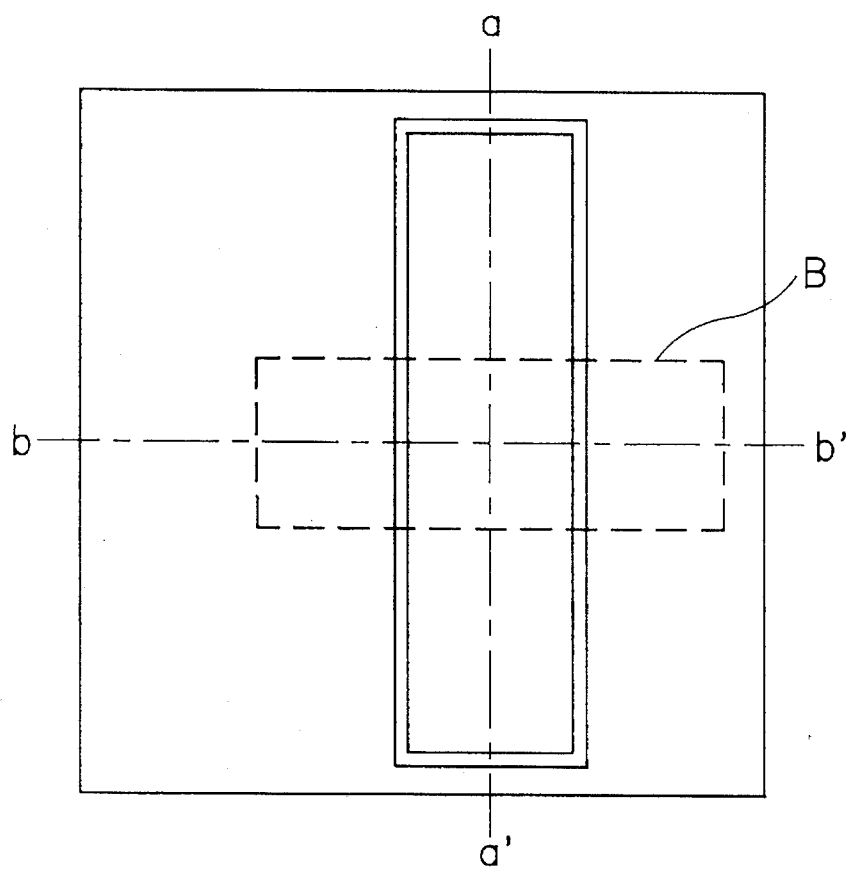
Figure 8B:
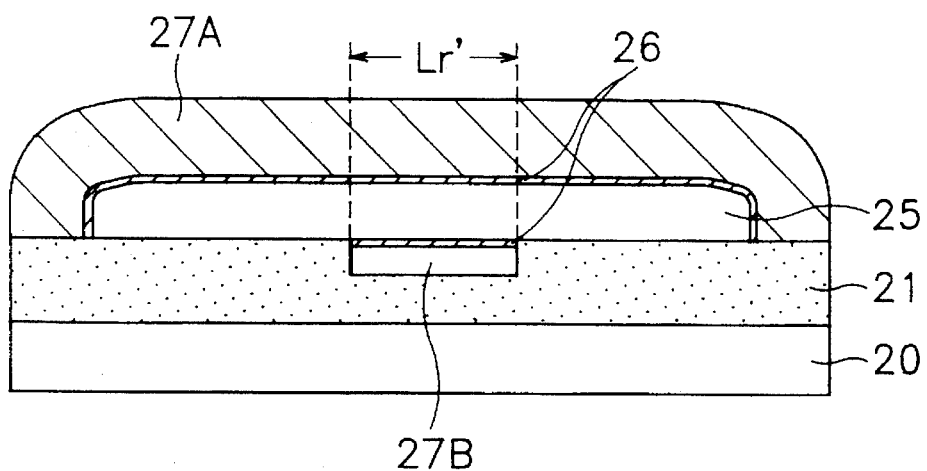
Figure 8C:
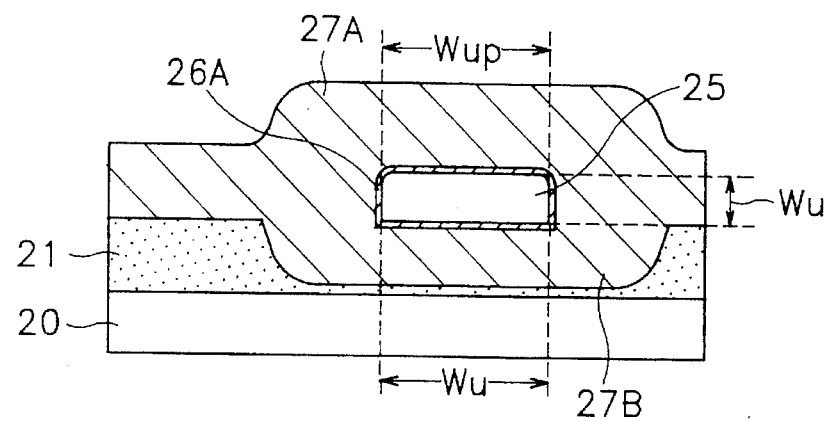
Figure 8D:
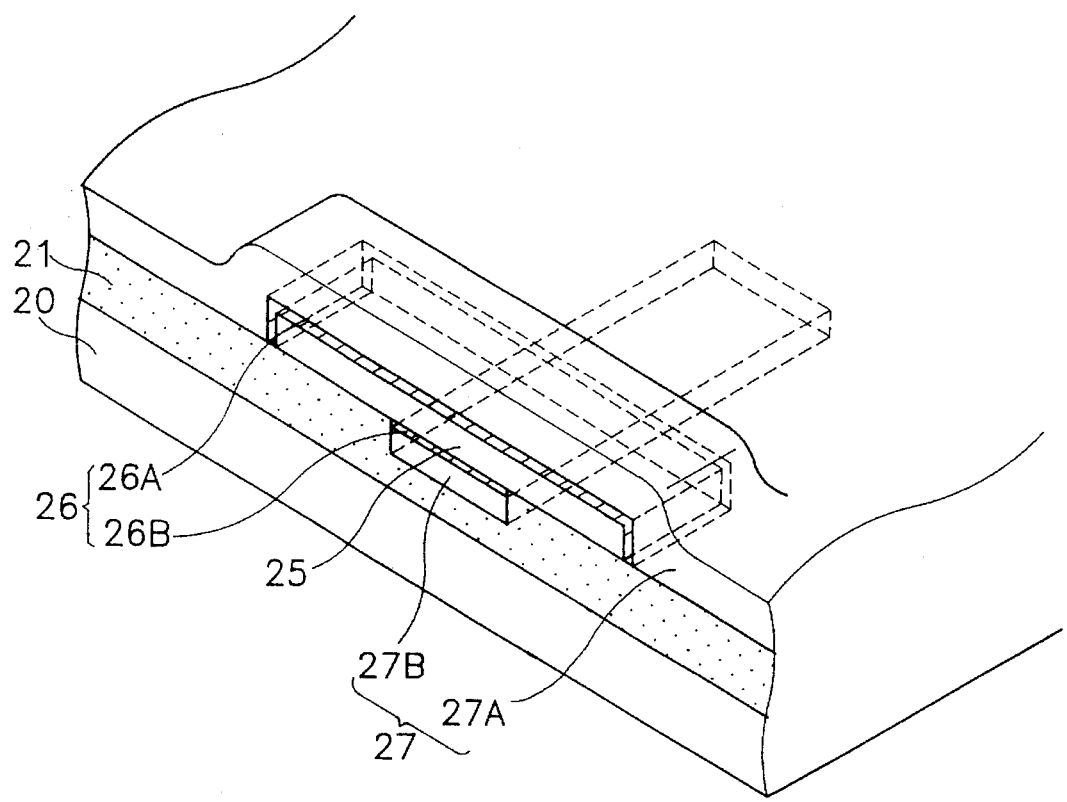

A gate oxide layer 26 is formed by thermal oxidation on the exposed active silicon region 25. As shown in FIG. 8D, each of gate oxide layers 26A, 26B is formed on both the upper and lower portions of the silicon layer 25. Ion implantation is performed regulate threshold voltage $V_T$. A polysilicon layer 27B is deposited to fill the cavity. A polysilicon 27A is formed on the surface of the substrate. FIG. 8A is a plan view of the substrate on which the above processes are performed, and FIGS. 8B and 8C are sectional views as respectively taken along lines a—a' and b—b'.

Figure 9A:
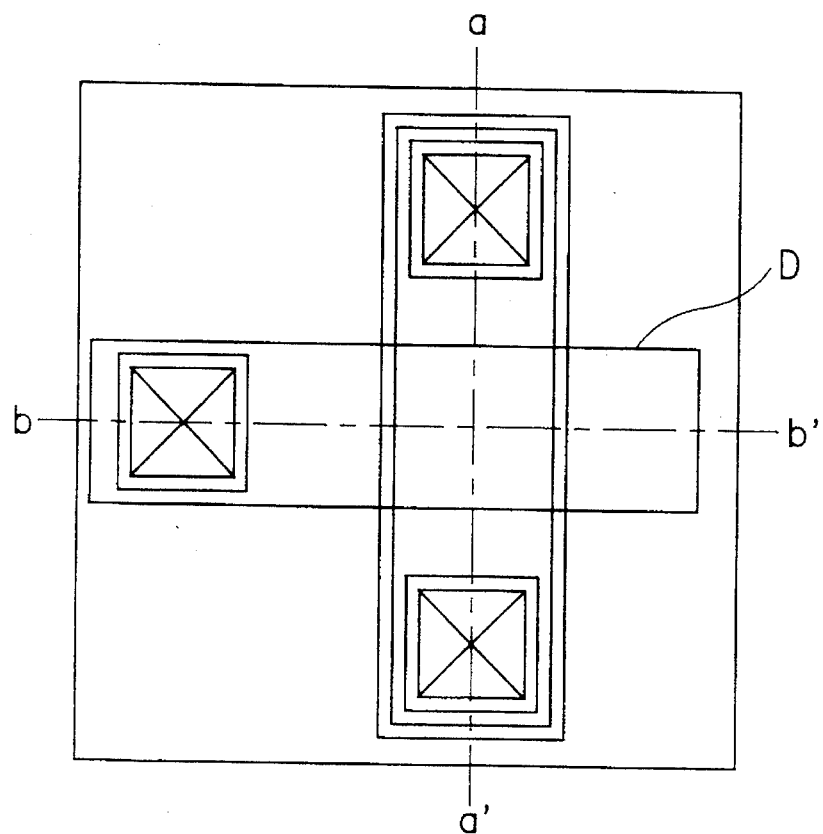
Figure 9B:
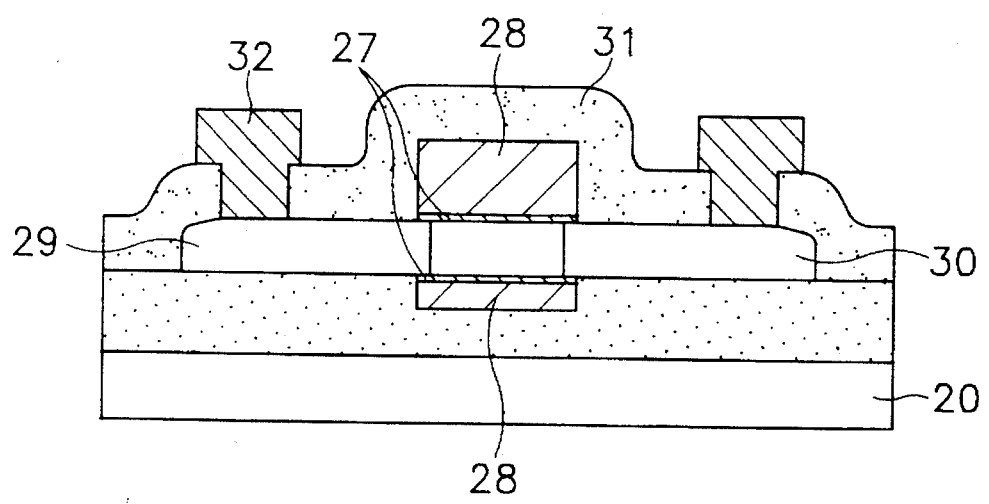
Figure 9C:
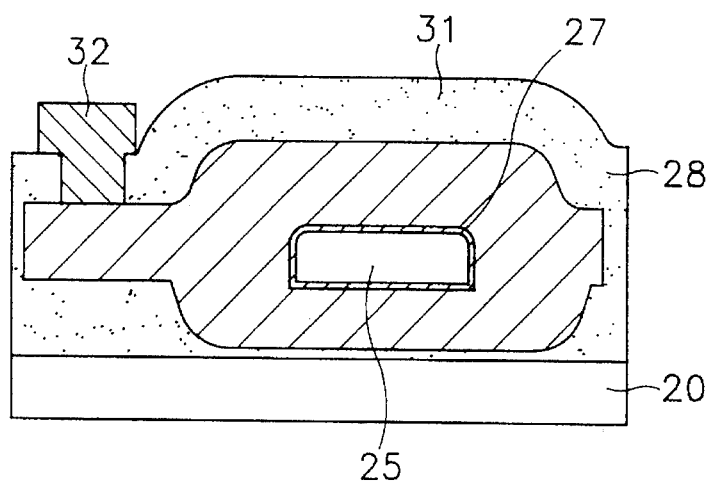

Referring now to FIGS. 8A, 8B, 8C and 8D, the polysilicon layer 27A is patterned, and the gate electrode 28 is formed by photo-etching, as shown in FIG. 9B.

The size of the gate electrode corresponds to a region D. After the formation of the gate electrode 28, ion implantation and drive-in processes are carried out so that source and drain regions 29, 30 are formed.

Figure 10:
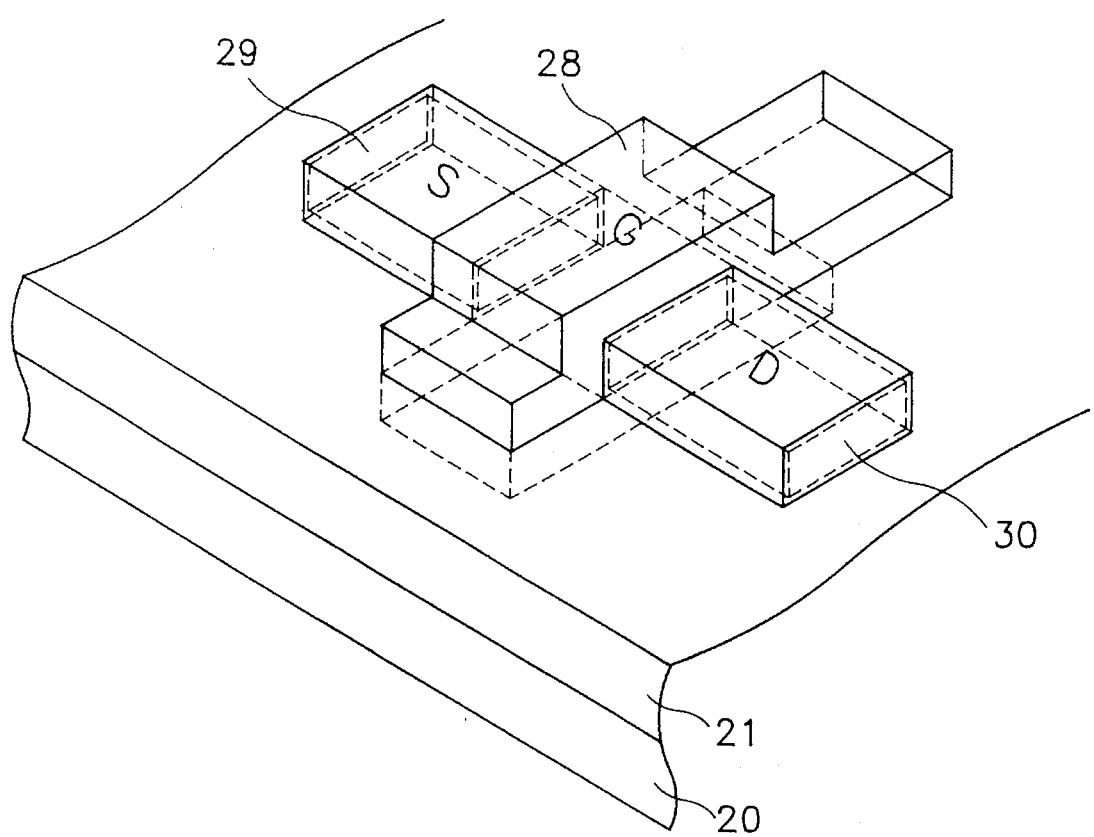
FIG. 10 is a perspective view of the structure of the SOI MOSFET.

An interlayer insulating layer 31 and a first metal line 32 are formed to manufacture the SOI MOSFET of the present invention. FIG. 10 is a perspective view of the device before the interlayer insulating layer is formed, and the operation principle of the present invention is basically the same as the conventional SOI GAA structure MOSFET. In the manufacture of the conventional device, there is a problem in the improvement of electrical characteristics of MOSFET according to the value of $L_r/W_r$. Since values of the real channel length $L_r'$ and the real channel width $W_r'$ are formed to be independent of each other, the present invention has a more effective improvement of the electrical characteristics than the conventional device has. Besides, since the thickness of the buried oxide layer has nothing to do with the channel width, defects may be minimized at the time of the manufacture of an SOI wafer, and production cost can be saved.

$L_r'/W_r'$ may be expressed as the following equation (4):

$$\frac{L_r'}{W_r'} = \frac{(L_p + L_{diff} + L_{ove}')}{2(W_u + W_s)} \quad (4)$$

$L_{diff}$ is a channel length extended at the time of nitrogen ion implantation and annealing, and Love' has a value of almost zero by high selection ratio $L_r'$ is dominant than $L_p$ in FIG. 8B.

A semiconductor memory device is a memory unit cell and has a metal oxide semiconductor (MOS) device and a capacitance. The SOI MOSFET may be used as the MOS device. The channel length/width is determined as follows, according to the design rule of a 256 M bit capacitance:

Example 1: If $L_p$=0.25 μm, $L_{diff}$=0.1 μm, $W_u$=0.25 μm, $W_s$=0.2 μm, $L_{ove}$=0.1×$W_u$=0.025, and $L_{ove}'$=0, $L_r/W_r$=0.58, $L_r'/W_r'$=0.39

Example 2: If $L_p$=0.6 μm, $L_{diff}$=0.2 μm, $W_u$=20 μm, $W_s$=0.2 μm, $L_{ove}$=0.1 μm, and $L_{ove}'$=0, $L_rW_r$=0.51, $L_r'/W_r'$= 0.019

In the above examples, since $W_r$ equals $W_r'$, $L_r'$ has a value smaller than $L_r$, and better electrical characteristics may be requested.

If the conventional method is used in the example 2, the thickness of the buried oxide layer is the same as the thickness of the gate oxide layer between the lower gate and silicon substrate, which may serve as a capacitor according to the difference of voltage applied between the gate and silicon substrate.

This may be a factor of degradation of the electrical elements and occurance of leakage current $I_{sub}$ by breakdown. If the thickness of the buried oxide layer is fully removed, e.g. about 1 μm, $W_u$ cannot be used more than about 2 μm.

The manufacturing steps in FIGS. 6A to 10 propose examples of concrete numerical values. A p-type silicon substrate is used, and the oxide layer is formed to a thickness of 500 angsttoms. Oxygen ions implanted thereto is $10^{18}$ atoms/cm$^2$, 180 KeV, and nitrogen ions are implanted at 7.5×$10^{17}$ atoms/cm$^2$, 140 KeV to form the oxynitride region 22. Annealing by ion implantation is performed for two hours at 1200° C. The etching thickness of the pad oxide layer and active silicon region are 500 angstroms and 2000 angstroms, respectively. Undercut-etching of the oxynitride is performed in $H_3PO_4$ at 170° C., and etching the pad oxide layer is to a thickness of 500 angstroms. The thickness of the gate oxide layer is 240 angstroms and boron ions are implanted at $10^{13}$ atoms/cm$^2$, 60 KeV. The condition of the drive-in process is 900° C., 30 min. in an ambient of $N_2$.

The thickness of the deposited polysilicon is 3000 angstroms, and As ions are implanted at 7×$10^{15}$, 100 KeV. Source and drain regions are formed by drive-in process for thirty minutes at 900° C. As an interlayer insulating layer, the oxide layer has a thickness of 6000 angstroms, and a first metal is formed to a thickness of 6000 angstroms to form the device.

According to the conventional SOI GAA structure. MOSFET, the channel length $L_r$ and thickness of the buried oxide layer are always dependent on the channel width, and $L_r/W_r$ cannot be small.

If the upper and lower portions of the channel width are increased, since the SOI wafer is manufactured with just the thin oxide layer between the silicon substrate and gate, such a structure becomes a factor of occurance of leakage current by deterioration to insulation of the oxide layer.

In the present invention, however, since the channel length and the thickness of the buried oxide layer may be formed independently of the channel width, $L_r'/W_r'$ value may be very small to obtain the improved electric characteristics of the device.

What is claimed is:

1. A method for making a semiconductor device having a silicon-on-insulator, gate-all-around structure comprising the steps of:

forming a pad oxide on a wafer which includes a lower silicon substrate, a buried insulator layer, and an upper silicon layer;

forming an oxynitride region on a portion of said buried insulator layer;

forming an active silicon layer to intersect said oxynitride region;

forming a cavity by wet-etching said exposed oxynitride region;

forming a gate insulating layer on the surface of the exposed active silicon layer;

depositing polysilicon to fill said cavity surrounding said active silicon layer;

removing a portion of said polysilicon to form a gate electrode; and forming source and drain regions on said active silicon layer separated by said gate electrode.

2. The method according to claim 1, wherein said oxynitride region is formed by nitrogen ion-implantation.

3. The method of claim 1, wherein said buried insulator layer is a buried oxide layer.

4. The method of claim 1, wherein said buried insulator layer is a buried nitride layer.

* * * * *